United States Patent [19]
Panov et al.

[11] 4,218,652
[45] Aug. 19, 1980

[54] APPARATUS FOR MEASURING THE INTENSITY AND DIRECTION OF EXTERNAL MAGNETIC FIELDS INCLUDING POWER SUPPLY AND RECORDING UNITS HAVING RESPECTIVE SEMI-CONDUCTOR DEVICES

[76] Inventors: Alexandr P. Panov, proesd Polbina, 32, kv. 119; Anatoly P. Salmin, ulitsa Karaganova, 2, kv. 65, both of Ulyanovsk, U.S.S.R.

[21] Appl. No.: 945,195

[22] Filed: Sep. 21, 1978

Related U.S. Application Data

[63] Continuation of Ser. No. 598,983, Jul. 24, 1975, abandoned.

[51] Int. Cl.² .......................................... G01R 33/02
[52] U.S. Cl. .................................................. 324/253
[58] Field of Search ................................ 324/253–255

[56] References Cited

U.S. PATENT DOCUMENTS

| 2,379,716 | 7/1945 | Hall | 324/253 |
| 3,330,996 | 7/1967 | Myers | |
| 3,439,264 | 4/1969 | Schonstedt | 324/254 |
| 3,541,432 | 11/1970 | Scarbrough | 324/255 |
| 3,699,426 | 10/1972 | Bauman | 321/27 R |

FOREIGN PATENT DOCUMENTS 229694 6/1973 U.S.S.R. ............................ 307/252 N

OTHER PUBLICATIONS

Groves, J. R.; A Pulsed Earth's Field Magnetometer; Proc. of IREE (Australia); Oct. 1971; pp. 377–378.
G. E. Transistor Manual; Gen. Elec. Co., 1964; Light Weight Ed.; p. 434.

Primary Examiner—Rudolph V. Rolinec
Assistant Examiner—Walter E. Snow
Attorney, Agent, or Firm—Haseltine, Lake & Waters

[57] ABSTRACT

A device for measuring the intensity and direction of external magnetic fields comprising a differential ferroprobe, a recording unit and a unit for feeding field windings of the ferroprobe, the latter unit including a thyristor, a capacitor one terminal of which is connected to one terminal of a power source and to one lead of the field windings, the other terminal of the capacitor being connected to a cathode of the thyristor and an anode of a diode whose cathode is connected to the other terminal of the power source and a control electrode of the thyristor, the anode of the thyristor being connected to the other lead of the field windings.

7 Claims, 6 Drawing Figures

APPARATUS FOR MEASURING THE INTENSITY AND DIRECTION OF EXTERNAL MAGNETIC FIELDS INCLUDING POWER SUPPLY AND RECORDING UNITS HAVING RESPECTIVE SEMI-CONDUCTOR DEVICES

CROSS-RELATED APPLICATION

This application is a continuation of Ser. No. 598,983 filed July 24, 1975 and now abandoned.

FIELD OF THE INVENTION

The present invention relates to measuring instruments and automatic equipment and, more specifically, a device for measuring the intensity and direction of external magnetic fields intended in particular, for measuring the intensity and direction of a magnetic field produced by local sources, for example, permanent magnets installed in mechanisms.

PRIOR ART

The foregoing functions are performed by a device comprising a power system, a Hall device, and an amplifier unit. In this device current is supplied to a crystal plate (Hall plate) and, as the external magnetic field acts upon the plate, there appears at the output terminals of the crystal plate a Hall electromotive force which amounts to 0.1 to 0.3 volt. This signal is then applied to a multistage amplifier and recorded. The Hall electromotive force is largely dependent upon temperature; the manufacture of crystal plates is costly and involves precision equipment.

There is also known a phase-sensitive magnetometer (cf. Yu. V. Afanassiev, "Ferrozondy" /"Ferroprobes"/, Energhiya Publishers, 1969, FIG. 42) comprising a ferroprobe, a power unit and a signal recording unit. The power unit includes a number of cascades built around transistors. The signal recording unit comprises a synchronous detector and a sign distributor. High-frequency oscillations of the power unit are applied to the field windings of the ferroprobe and, in the presence of an external magnetic field, there appears across the output winding of the ferroprobe a double-frequency voltage (the second harmonic). Said voltage is applied to the recording unit, where it is recorded and detected and where its phase is determined. Due to the fact that the output signal of the ferroprobe is a double-frequency and low-amplitude sinusoid the known magnetometer is complicated in design and not sufficiently reliable.

SUMMARY OF THE INVENTION

It is an object of the present invention to provide a device of a simple design, which will make it possible to raise the reliability and accuracy of measuring the intensity and direction of external magnetic fields.

The present invention essentially resides in that in a device for measuring the intensity and direction of external magnetic fields, comprising a differential ferroprobe having a core, field windings and a working winding, a power supply unit of the field windings, and a recording unit connected to the working winding of the ferroprobe, the power supply unit comprises, in accordance with the invention, a thyristor, a capacitor one output of which is connected to one terminal of a power source and one lead of the field windings, its other output being connected to a cathode of the thyristor and an anode of a diode whose cathode is connected to the other terminal of the power source and a control electrode of the thyristor, an anode of the thyristor being connected to another lead of the field windings. The recording unit comprises a thyristor whose control electrode is connected to one lead of the working winding, its anode being connected to one output terminal, whereas its cathode is connected to another lead of the working winding and a second output terminal.

It is expedient that the proposed device for measuring the intensity and direction of external magnetic fields have two additional series connected diodes, the anode of the first additional diode being connected to one output of the capacitor, the cathode of the second additional diode being connected to the other output of the capacitor, their common point being connected to one terminal of the power source.

It is also expedient that the device for measuring the intensity and direction of external magnetic fields include a compensation ferroprobe having a core, the field windings of this probe being connected to the power unit of the main ferroprobe, its working winding being connected to that of the main ferroprobe.

It is preferable that in the proposed device for measuring the intensity and direction of external magnetic fields the power unit include a dynistor instead of the thyristor.

In the proposed device the ferroprobe's output signal amounts to tens of volts. This has made it possible to simplify the design of the device, make it small-sized and highly reliable. This also considerably expands the sphere of application of the device which can be used, in particular, for reading out information from magnetic addressing devices in mechanically transporting single items inside a factory.

BRIEF DESCRIPTION OF THE DRAWINGS

Other objects and advantages of the present invention will become more apparent from the following detailed description of a preferred embodiment thereof taken in conjunction with the accompanying drawings, wherein.

DETAILED DESCRIPTION

Figure 1:
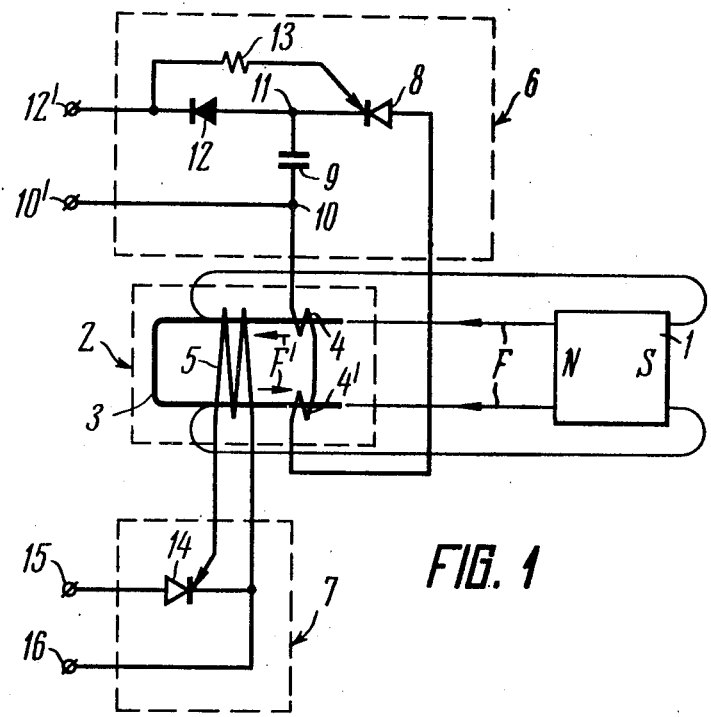
FIG. 1 is a circuit diagram of a device for measuring the intensity and direction of external magnetic fields in accordance with the invention.

Referring now to the attached drawings, the proposed device for measuring the intensity and direction of external magnetic fields F produced, for example, by a permanent magnet 1 (FIG. 1) comprises a differential ferroprobe 2 having a core 3, field windings 4 and 4' (connected, for example, in series), and a working winding 5.

FIG. 1 also shows magnetic fluxes F' of opposite direction, which are produced in the core 3 by current flowing through the field windings 4 and 4'.

The device also comprises a power supply unit 6 for the field windings 4 and 4', and a recording unit 7 connected to the working winding 5.

The power unit 6 comprises a thyristor 8 and a capacitor 9 of which one terminal or output 10 is connected to one terminal 10' of a power source (not shown) and to one lead of the field windings 4 and 4', another terminal or output 11 of the capacitor 9 being connected to the cathode of the thyristor 8 and the anode of a diode 12. The cathode of the diode 12 is connected to the other terminal 12' of the power source and the control electrode of the thyristor 8, for example, via a resistor 13. The anode of the thyristor 8 is connected to the other lead of the field windings 4 and 4'. The recording unit 7 comprises a thyristor 14 whose control electrode is connected to one lead of the working winding 5, the anode of the thyristor 14 being connected to one output terminal 15, its cathode being connected to another lead of the working winding 5 and a second output terminal 16.

Figure 2:
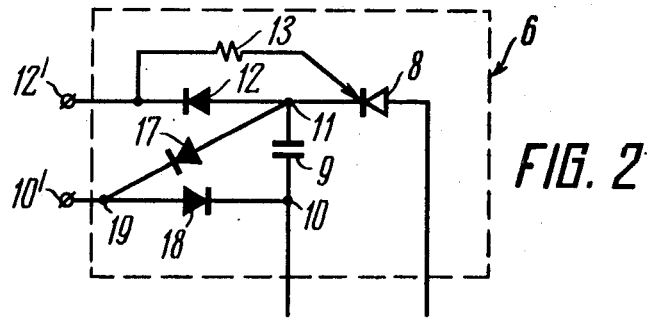
FIG. 2 is an embodiment of the power unit with additional series connected diodes in accordance with the invention.

FIG. 2 shows an embodiment of the power supply unit 8 having additional series connected diodes 17 and 18. The anode of the first additional diode 17 is connected to the output 11 of the capacitor 9, the cathode of the second additional diode 18 being connected to the other output 10 of the capacitor 9, a common point 19 of said diodes being connected to the terminal 10' of the power source.

Figure 3:
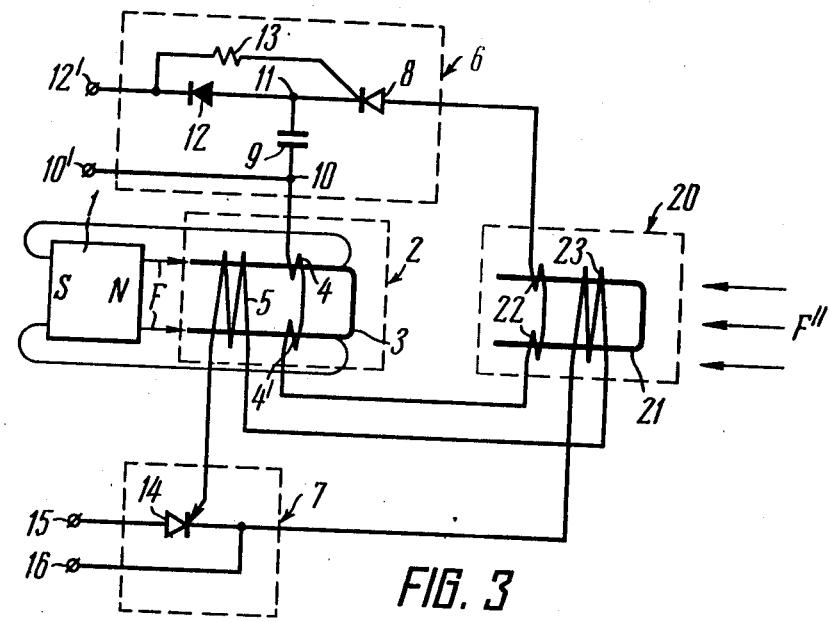
FIG. 3 is a circuit diagram of a device for measuring the intensity and direction of external magnetic fields with a compensation ferroprobe in accordance with the invention.

FIG. 3 shows a device for measuring the intensity and direction of external magnetic fields, having a compensation ferroprobe 20 comprising a core 21 and field windings 22 connected in parrallel with the power supply unit 6 or in series with the field windings 4 and 4' of the main ferroprobe 2. A working winding 23 of the compensation ferroprobe 20 is connected in opposition to the working winding 5 of the main ferroprobe 2. FIG. 3 also shows uniform magnetic fluxes F''', for example, the magnetic field of the Earth.

Figure 1A:
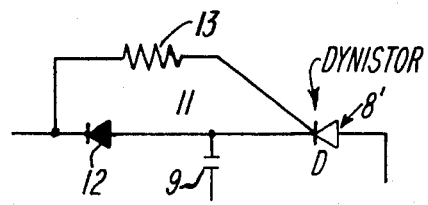
FIG. 1A shows a modified portion of the circuit in FIG. 1.
Figure 3A:
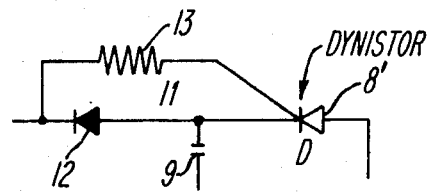
FIG. 3A shows a modified portion of the circuit in FIG. 3.

In the devices of FIGS. 1 and 3 a dynistor may be employed instead of the thyristor 8 as the bistable semiconductor means. The dynistors are shown at 8' in FIGS. 1A and 3A respectively.

Figure 4:
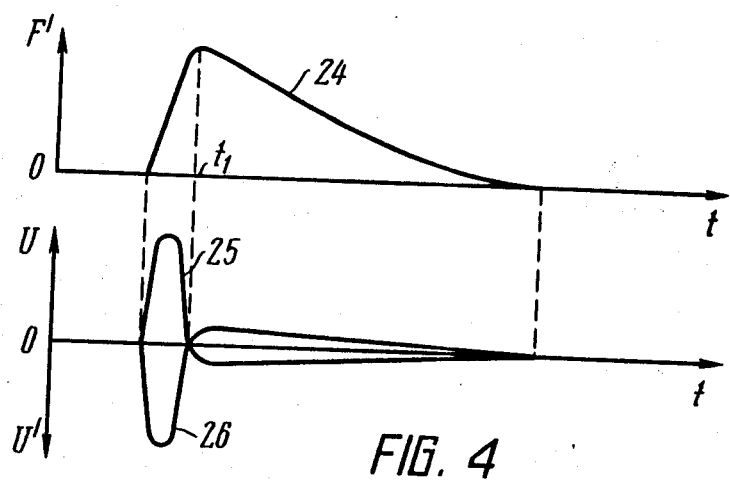
FIG. 4 shows time variation curves of the magnetic flux and output voltages of the ferroprobe in accordance with the invention.

FIG. 4 shows variation curves 24, depending on time t, of magnetic fluxes F' produced in the core 3 (FIG. 1) by current flowing through the windings 4 and 4' following a discharge of the capacitor 9, and variation curves 25, depending on time t, of voltages U and U' induced by said fluxes F' across the working winding 5.

In the absence of the external magnetic field F, the proposed device operates as follows. Commercial frequency voltage, for example, of 50 Hz, is applied to the terminals 10' (FIG. 1) and 12' of the power supply unit 6. During the first half-period of the alternating voltage the capacitor 9 is charged via the diode 12. A positive potential appears at the output 10 of the capacitor 9, whereas at the output 11 there is a negative potential. During the next half-period the supply voltage is changed in sign, and the positive potential of the power source is applied via the resistor 13 to the control electrode of the thyristor 8. The latter is driven into conduction, and the capacitor 9 is discharged through the circuit: output 10—field windings 4 and 4' of the ferroprobe 2—thyristor 8—output 11. In the next half cycle the supply voltage is changed in sign, and its positive potential is applied to the output 10 of the capacitor 9. The capacitor 9 is charged. In the next half cycle the supply voltage again changes its sign, the thyristor 8 becomes conductive, and the capacitor 9 is discharged via the windings 4 and 4'. The process goes on in a cyclic manner at the frequency of the supply voltage applied to the power supply unit 6.

A discharge of the capacitor 9 results in a flow of current through the windings 4 and 4', which current produces the magnetic fluxes F' of opposite direction in the core 3.

Variation of the magnetic fluxes F' is uniform with time and is shown in FIG. 4 (the curve 24). The magnetic fluxes F' increase sharply up to the moment of time $t_1$ after which they slowly decrease.

FIG. 4 further shows variations with time t in the voltages U and U' induced by the magnetic fluxes F' across the winding 5 (the curves 25 and 26).

The magnetic flux F', produced by the current flowing through the winding 4, induces in the winding 5 the voltage U (the curve 25), whereas the magnetic flux F', produced by the current flowing through the winding 4', induces the voltage U' (the curve 26). The leading edges of the magnetic fluxes F' induce the voltages U and U' of small duration, but high amplitude; the trailing edges thereof induce voltages of great duration, but small amplitude. The voltages U and U' have equal magnitudes, but different directions, hence, they are compensated, so there is no voltage across the control electrode of the thyristor 14 (FIG. 1).

As the magnet 1 is brought into play, the magnetic field F acts upon the core 3 of the ferroprobe 2. The direction of the magnetic field F corresponds to the magnetic flux F', produced by the current through the winding 4, and is opposite to the magnetic flux F' produced by the current through the winding 4'. As a result, the voltages U and U' (FIG. 4) induced across the winding 5 (FIG. 1) are changed in amplitude, and a potential difference appears at the output of the winding 5. A signal arrives at the control electrode of the thyristor 14, the polarity of said signal being determined by the direction of the external magnetic field F, whereas the amplitude (magnitude) of the signal from the winding 5 depends upon the intensity of the field F.

If voltage of positive polarity is applied to the control electrode of the thyristor 14, the thyristor 14 is driven into conduction and shunts the output terminals 15 and 16, so there is current through the load (not shown).

As the magnet 1 changes its polarity, the output voltage of the winding 5 is changed in sign, and voltage of negative polarity is applied to the control electrode of the thyristor 14. The latter remains non-conducting, so there is no current through the load, which means that the device distinguishes the direction of the external magnetic field.

If the series connected additional diodes 17 and 18 (FIG. 2) are included in the power supply unit 6, the proposed device operates as follows. As voltage is supplied, the capacitor 9 is charged via the following circuit: terminal 10'—point 19—diode 18—output 10—capacitor 9—output 11—diode 12—terminal 12'. During the following half period current flows through the circuit: terminal 12'—resistor 13—control electrode of thyristor 8—cathode of thyristor 8—output 11—diode 17—point 19—terminal 10'. In this case the control current of the thyristor 8 does not pass through the capacitor 9; the latter's charge remains constant, so there is no re-charging of the capacitor 9. This increases the operational stability of the device; in addition, the function of the capacitor 9 may be performed by polarized capacitors, which makes it possible to cut down the size of the device.

In the course of measuring external magnetic fields produced by local sources, for example, permanent magnets, the ferroprobe 2 (FIG. 1) is acted upon by the magnetic field of the Earth or other uniform magnetic fluxes F″. In this case the device measures the total intensity of the external magnetic fields. For that reason the device can be used for measuring the magnetic field of the Earth.

In measuring magnetic fields produced by weak sources, or in order to raise the accuracy of measuring magnetic fluxes produced by local sources, the effects of the Earth's magnetic field must be cancelled. This is achieved by introducing the compensation ferroprobe 20 (FIG. 3).

As voltage is supplied to the terminals 10′ and 12′, the capacitor 9 is charged via the above-mentioned circuit. In the next half period said capacitor is simultaneously discharged through the field windings 4, 4′ and 22 of the main ferroprobe 2 and the compensation ferroprobe 20. The magnetic field F of the permanent magnet 1 only acts upon the core 3 of the main ferroprobe 2, as the ferroprobe 20 is outside the zone of action of the magnetic field F produced by the permanent magnet 1. Meanwhile, the uniform magnetic fluxes F″, for example, of the magnetic field of the Earth, permeate the cores 3 and 21 of the main ferroprobe 2 and the compensation ferroprobe 20, respectively, and thus account for equal components of the output voltages U and U′ across the windings 5 and 23. These output voltages are compensated and are not applied to the control circuit of the thyristor 14. This means that the device does not react to the uniform external field, and the thyristor 14 in the recording unit 7 is only driven into conduction by the external magnetic field F produced by the permanent magnet 1 of a respective polarity.

The invention raises the reliability and simplifies the structure of the device and accounts for an increased accuracy of measuring the intensity and direction of external magnetic fields.

What is claimed is:

1. A device for measuring the intensity and direction of external magnetic fields, comprising a differential ferroprobe including a core, field windings on said core and a working winding on said core; a power supply unit including a power source connected to said field windings; a recording unit connected to said working winding and including output terminals; the improvement wherein said power supply unit comprises a diode; a capacitor having first and second terminals; said first terminal of said capacitor being connected to one terminal of said power source and one lead to said field windings; said other terminal of said capacitor being connected to the anode of said diode; the cathode of said diode being connected to the other terminal of the power source; and bistable semi-conductor means connected to said power source for selectively connecting the capacitor to said field windings depending on the polarity of the power source, said recording unit comprising further bistable semi-conductor means connected to said working winding for operatively connecting said output terminals to the working winding depending on the polarity of the voltage induced in said working winding.

2. A device for measuring the intensity and direction of external magnetic fields as claimed in claim 1, wherein said power supply circuit further comprises two series connected additional diodes; the anode of said first additional diode being connected to one of said terminals of said capacitor; the cathode of said second additional diode being connected to said second terminal of said capacitor; a common point of said two additional diodes being connected to one of said terminals of the power source.

3. A device for measuring the intensity and direction of external magnetic fields as claimed in claim 1, further comprising a compensation ferroprobe including a core, field windings on said core and a working winding on said core; said field windings of said compensation ferroprobe being connected to said power supply unit; said working winding of the compensation ferroprobe being connected in opposition to said working winding of the first said ferroprobe.

4. A device for measuring the intensity and direction of external magnetic fields as claimed in claim 2, comprising a compensation ferroprobe including a core, field windings on said core and a working winding on said core, said field windings of said compensation ferroprobe being connected to said power supply unit; said working winding of the compensation ferroprobe being connected in opposition to said working winding of the first said ferroprobe.

5. A device for measuring the intensity and direction of external magnetic fields as claimed in claim 3 wherein the first said bistable semi-conductor means comprises a dynistor.

6. A device for measuring the intensity and direction of external magnetic fields as claimed in claim 1 wherein the first said bistable semi-conductor means comprises a thyristor having a cathode connected to the other terminal of the capacitor, a control electrode connected to the other terminal of said power source, and an anode connected to the other lead of the field windings, said further bistable semi-conductor means comprising a further thyristor having a control electrode connected to one lead of said working winding, an anode connected to one of said output terminals, and a cathode connected to the other lead of the working winding and to a second output terminal.

7. A device for measuring the intensity and direction of external magnetic fields as claimed in claim 1 wherein the first said bistable semi-conductor means comprises a dynistor.

* * * * *